(12) United States Patent
Felix

(10) Patent No.: US 7,577,048 B2
(45) Date of Patent: Aug. 18, 2009

(54) MEMORY INTERFACE

(75) Inventor: Stephen Felix, Bristol (GB)

(73) Assignee: Icera, Inc., Wilmington, DE (US)

( * ) Notice: Subject to any disclaimer, the term of this patent is extended or adjusted under 35 U.S.C. 154(b) by 74 days.

(21) Appl. No.: 11/967,540

(22) Filed: Dec. 31, 2007

(65) Prior Publication Data

US 2009/0172459 A1    Jul. 2, 2009

(51) Int. Cl.
*G11C 7/00* (2006.01)
(52) U.S. Cl. .................. 365/194; 365/193; 365/226; 365/233
(58) Field of Classification Search .......... 365/194, 365/193, 226, 233
See application file for complete search history.

(56) References Cited

U.S. PATENT DOCUMENTS 6,292,412 B1 * 9/2001 Kato et al. .................. 365/194
6,850,458 B2 * 2/2005 Li .......................... 365/233.12
7,274,605 B2 * 9/2007 Stubbs ....................... 365/194

* cited by examiner

*Primary Examiner*—Connie C Yoha
(74) *Attorney, Agent, or Firm*—McDermott Will & Emery, LLP

(57) ABSTRACT

A double data rate memory interface circuit for transferring data between an interfacing device and double data rate memory device. The interface circuit comprises a data input for receiving a data signal from a first of those devices, and a strobe input for receiving a strobe signal from that first device. The interface circuit also comprises delay circuitry for supplying the data and strobe signals to the other device with a timing offset introduced therebetween. The delay circuitry comprises a software programmable storage medium and a digitally controllable delay element coupled to the storage medium, the delay element being arranged to control the timing offset in dependence on a delay setting programmed into that storage medium.

36 Claims, 4 Drawing Sheets

MEMORY INTERFACE

FIELD OF THE INVENTION

The present invention relates to controlling a delay between a data signal and a strobe signal in an interface with a double data rate memory.

BACKGROUND

A controller for a double data rate (DDR) memory device must meet certain timing requirements. Such requirements are currently specified in two standards of the JEDEC Solid State Technology Association (once known as the Joint Electron Device Engineering Council). These are: JEDEC standard JESD79 ("Double Data Rate (DDR) SDRAM Specification") and JEDEC standard JESD209 ("Low Power Double Data Rate (DDR) SDRAM Specification"), available from www.jedec.org.

Of the timing requirements, the two most problematic are as follows.

The first is meeting the setup and hold requirements of the (double-rate) data to be written to the memory (e.g. tDS and tDH in the above JEDEC standards). Ideally a timing offset should be generated between the write strobe and the DDR write data (e.g. the DQS write strobe in the above JEDEC standards).

The second is sampling the (double-rate) read data returning from the DDR chip using the 'strobe' signals which transition at very nearly the same time as the data. Ideally a timing delay should be added to the incoming read strobe before using it to sample the DDR data (e.g. the DQS read strobe in the above JEDEC standards).

A timing offset on the DQS write strobe can be achieved by using a double-rate internal clock (or a two-phase, single rate internal clock with a quarter cycle offset). However, guaranteeing the availability of such an internal clock comes at a cost (a clock running at some even multiple of the memory clock must exist).

The delay for the DQS read strobe can be generated by contriving a tuneable delay circuit (the same circuit can then also be used to offset the write data with respect to the DQS write strobe. However, the mechanism by which this delay is tuned (usually a Phase-Locked-Loop or a Delay-Locked-Loop) requires careful design.

SUMMARY

According to one aspect of the present invention, there is provided a double data rate memory interface circuit for transferring data between an interfacing device and double data rate memory device clocked on both rising and falling edges of a clock signal, the interface circuit comprising: a data input for receiving a data signal from a first of said devices; a strobe input for receiving a strobe signal from said first device, the strobe signal validating the data signal for sampling by the other of said devices; and delay circuitry coupled to said data and strobe inputs for supplying the data and strobe signals to said other device with a timing offset introduced therebetween, the delay circuitry comprising a software programmable storage medium and a digitally controllable delay element coupled to the storage medium, the delay element being arranged to control said timing offset in dependence on a programmed delay setting programmed into said storage medium.

Thus the present invention provides a software programmable mechanism instead of a purely autonomous hardware mechanism. Thus, the task of trimming the delay settings can be performed under software control. This avoids the need for a complicated design of the hardware to avoid timing glitches or other difficulties in tuning the delay, since such factors can be handled in software. Timing bugs can be fixed by making adjustments to the software.

Preferably the memory interface circuit comprises characterisation circuitry for characterising said delay element in order to generate a characterised delay setting, the characterisation circuit being arranged such that the characterised delay setting is accessible to software.

Thus the task of monitoring the delay can also advantageously be performed by software, aiding in the software control of the delay setting.

Furthermore, preferably the delay element is operable to hold off transfer of data whilst the delay setting in said storage medium is updated.

If a completely autonomous hardware mechanism was used, then that mechanism may attempt to autonomously alter the delay setting from time-to-time in order to compensate for variations in the delay caused by temperature or supply voltage fluctuations. But that would require careful design of the mechanism to ensure that the strobes do not 'glitch' if the delay setting is altered during a transaction with the DDR memory. The software mechanism can avoid such problems by holding off transactions with the DDR memory momentarily, allowing the delay settings to be adjusted without any risk of corrupted transactions.

In further embodiments, the characterisation circuit may be coupled to said storage medium and may be arranged to receive a software override, to supply said characterised delay setting to said storage medium to control said timing offset when the software override is not asserted, and to allow the timing offset to be controlled by the programmed delay setting when the software override is asserted.

The characterised delay setting may be accessible to software via said storage medium.

The characterisation circuit may be arranged to generate said characterised delay setting so as to represent a delay of substantially a quarter of a cycle of said clock signal.

The characterisation circuit may comprise a delay locked loop comprising a plurality N of delay elements in series, each substantially the same as the delay element of said delay circuitry, the delay locked loop being arranged to keep the total delay of said N delay elements substantially equal to a predetermined number M of cycles of said clock signal such that the characterised delay setting represents M/N of a cycle of said clock signal. M may be one and N may be four.

The delay element may comprise a plurality of delay stages, each stage being selectable for inclusion in a delay path in dependence on the delay setting in said storage medium.

Said storage medium may comprise a software programmable register.

In preferred embodiments, the memory interface circuit is arranged to operate according to at least one of standards JESD79 and JESD209.

The present invention has been found to be particularly applicable to these standards.

According to another aspect of the present invention, there is provided a method of transferring data between an interfacing device and a double data rate memory device clocked on both rising and falling edges of a clock signal, the interface circuit comprising: receiving a data signal from a first of said devices; receiving a strobe signal from said first device, the strobe signal validating the data signal for sampling by the other of said devices; and supplying the data and strobe signals to said other device with a timing offset introduced therebetween, by executing software to program a delay setting into a storage medium coupled to a digitally controllable delay element, thus operating the delay element to control said timing offset in dependence the delay setting programmed into said storage medium.

According to another aspect of the present invention, there is provided a method of transferring data between an interfacing device and a double data rate memory device clocked on both rising and falling edges of a clock signal, the interface circuit comprising: receiving a data signal from a first of said devices; receiving a strobe signal from said first device, the strobe signal validating the data signal for sampling by the other of said devices; and supplying the data and strobe signals to said other device with a timing offset introduced therebetween, by executing software to program a delay setting into a storage medium coupled to a digitally controllable delay element, thus operating the delay element to control said timing offset in dependence the delay setting programmed into said storage medium.

BRIEF DESCRIPTION OF THE DRAWINGS

For a better understanding of the present invention and to show how it may be carried into effect, reference will now be made by way of example to the accompanying drawings in which.

DETAILED DESCRIPTION OF PREFERRED EMBODIMENTS

Figure 1:
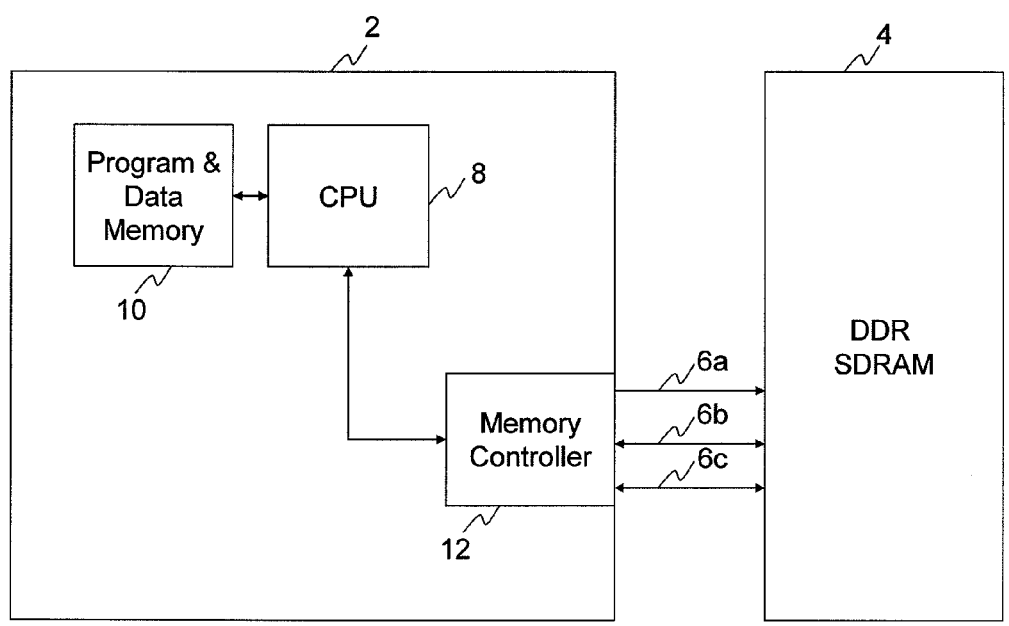
FIG. 1 is a schematic block diagram of a processor chip and memory.

FIG. 1 shows schematically an integrated circuit (IC) device 2 and an external double data rate (DDR) synchronous dynamic random access memory (SDRAM) device 4. The IC 2 is a processor chip comprising a central processing unit (CPU) 8, internal memory 10 comprising program and data memory, and a memory controller 12 for interfacing with the external DDR memory 4 (i.e. external to the IC). The internal memory 10 is coupled to the CPU and the CPU is coupled to the memory controller 12. The memory controller connects to the external DDR memory 4 by a link including at least a clock connection 6a, a data connection 6b and a strobe connection 6c. In this connection, the data connection is thirty-two bits wide.

In operation, the CPU 8 executes software from the program memory. The software typically comprises code which, when executed by the CPU 8, reads and/or writes data to the data memory. Furthermore, the software also comprises code which when executed reads data from and/or writes data to the external DDR memory 4. The data could be provided from or to the CPU 8 or another part of the processor chip 2 using a DMA engine (not shown). The memory controller 12 handles the sampling of data from or output of data to the external DDR memory 4.

During a write from the processor 2 to the DDR memory 4, the memory controller 12 supplies a clock signal to the DDR memory 4 on the clock connection 6a. The memory controller also passes data from the CPU 8 or other part of the chip 2 to the DDR memory 4 on the data connection 6b. Further, to validate the data for sampling by the DDR memory 4, the memory controller 12 supplies the DDR memory 4 with a strobe signal on the strobe connection 6c. For a write, the strobe signal indicates when data is valid for sampling by the DDR memory 4. During a read from the DDR memory 4 to the processor 2, the memory controller 12 still provides the clock signal to the DDR memory 4 on the clock connection 6a, but the DDR memory 4 provides the read data to the CPU 8 or other part of the chip 2 on the data connection 6b and the strobe signal on the strobe connection 6c. For a read, the strobe signal indicates when data is valid for sampling by the memory controller 12.

The strobe connection 6c is referred to as the DQS pin and the strobe signal is referred to as the DQS signal in the JEDEC standards JESD79 and JESD209. The generation and use of such strobe signal will be familiar to a person skilled in the art and is not discussed further herein.

However, as mentioned, in order to meet timing constraints, it is desirable to generate a timing offset between the write strobe and the DDR write data, and to add a delay to the incoming read strobe before using it to sample the DDR data. The timing offset in either case is preferably a quarter of a cycle of the clock signal (the same clock signal as used to clock the DDR memory 4). A delay mechanism is included in the memory controller 12 to achieve this.

If a completely autonomous hardware mechanism was used, then it may attempt to alter the delay setting autonomously from time-to-time in order to compensate for variations in the delay caused by temperature or supply voltage fluctuations. In that case, a complex hardware design would be required to ensure that the strobes do not 'glitch' if the delay setting is altered during a transaction with the DDR memory 4.

This could be achieved in a number of ways. For instance; if a digitally controlled delay circuit was used, then the delay setting could be Gray-coded or thermometer-coded; then the delay adjustment mechanism could be restricted to changing the delay one step at-a-time. Glitches could be avoided even during on-the-fly adjustments. However, such coding comes at a price.

In an IC where the supply voltage is changed on-the-fly to save power, the digitally controlled delay circuits may be vulnerable to errors if the adjustment mechanism does not keep up.

Further, timing accurate simulations of any autonomous hardware adjustment mechanism would be necessary to ensure that it starts up and behaves correctly. Any shortcomings could be corrected only by changing the circuit, which would be an expensive, especially in today's small geometry CMOS processes.

The following circuit simplifies this design problem.

Figure 2:
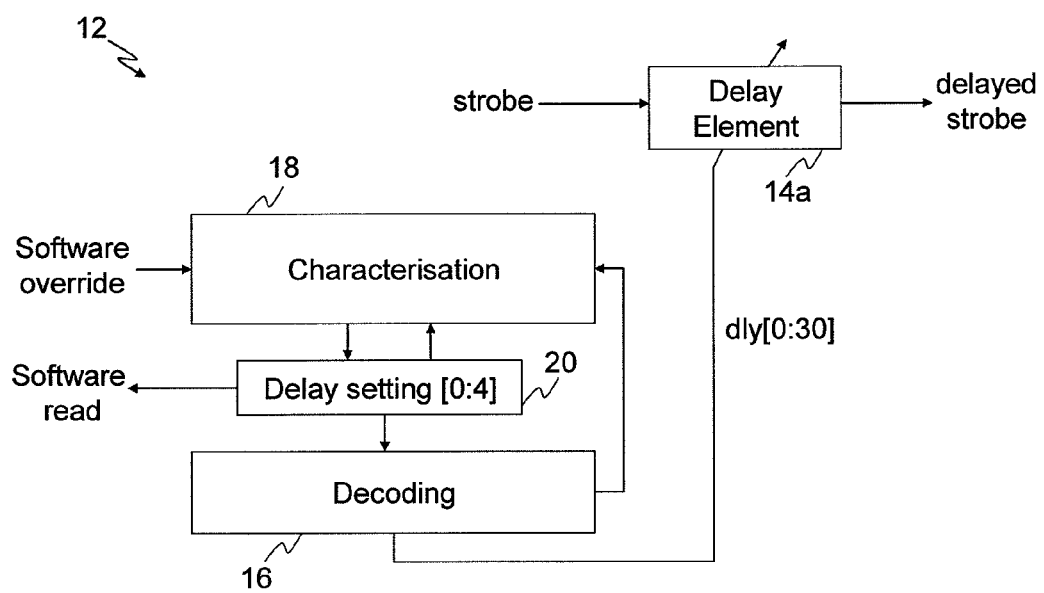
FIG. 2 is a schematic block diagram of part of a memory controller.

FIG. 2 shows schematically a part of the memory controller 12 for adding a delay to the strobe signal in order to offset it from the data signal, either before it is output to the DDR memory 4 for a write or as it arrives from the DDR memory 4 for a read. This delay circuitry comprises a digitally controllable delay element 14a coupled to decoding logic 16, which in turn is coupled to a software programmable register 20. The delay circuitry also comprises a characterisation circuit 18 which is coupled to the programmable register 20 and decoding logic 16. In this example, the programmable register 20 is five-bits and the connection from the decoding logic to the delay element 14a is up to thirty-two bits wide. The register preferably comprises dedicated latches in the memory controller.

The characterisation circuit 18 is arranged to receive a software override from the CPU 8 via a chip controller (not shown). The programmable register 20 is arranged to be readable by software, preferably by coupling it to another, memory-mapped register (not shown) which can be read by the CPU 8 (although in principle the register 20 could itself be memory mapped).

Figure 4:
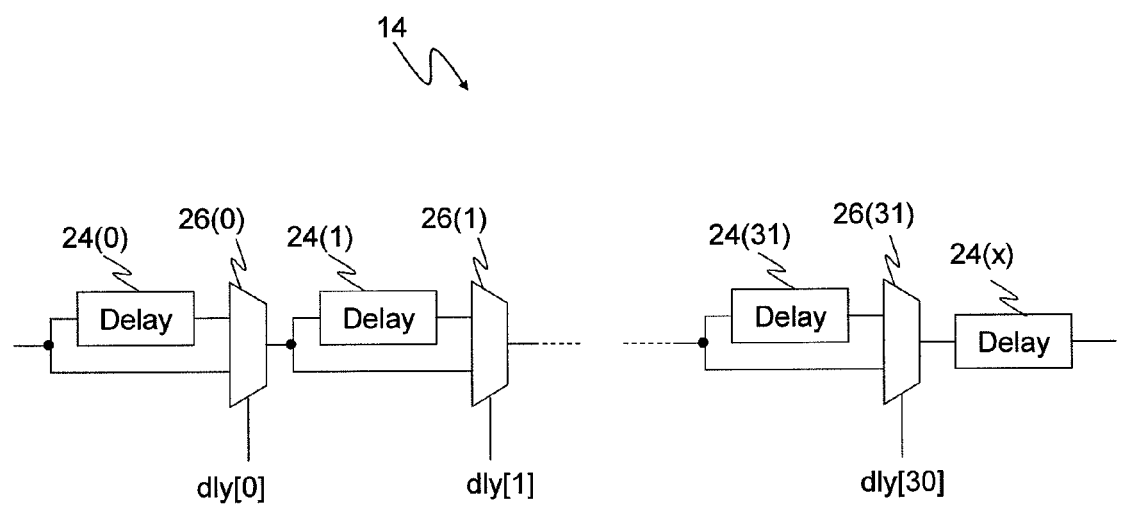
FIG. 4 is a schematic block diagram of a delay line.

The delay element 14a is shown schematically in more detail in FIG. 4. It comprises a plurality of delay stages 24 and a plurality of respective two-way multiplexers 26 connected as a digitally controllable delay chain. The input of the chain is connected to the input of the first delay stage 24(0) and to an input of the first multiplexer 26(0), with the other input of the first multiplexer 26(0) being connected to the output of the first delay stage 24(0). The control input of the first multiplexer 26(0) is connected to receive the first bit dly[0] from the decode logic 16. The input of each subsequent delay stage 24(n) and an input of each respective subsequent multiplexer 26(n) are connected to the output of the previous multiplexer 26(n−1), with the other input of each multiplexer 26(n) being connected to the output of its respective delay stage 24(n). The control input of each multiplexer 26(n) is connected to receive a respective one of the bits dly[0:30] from the decode logic 16. The chain may also include one or more extra delay stages 24(x) not associated with a multiplexer, to provide a certain minimum delay which is not selectable.

In operation, the software provides a software override to the characterisation circuit. In this example, the software override is six bits wide with one bit to assert the software override and the other five bits to carry the actual delay setting to be programmed into the programmable register 20. When the software override is asserted, the characterisation circuit 18 allows that setting to be programmed into the register 20, allowing direct software control of the delay setting. The characterisation circuit 18 does not interfere in the delay setting when the software override is asserted (the main function of the characterisation circuit will be discussed later).

The setting in the register 20 is visible to the decode logic 16, which converts the five bit binary value of that setting into (up to) thirty-one bits dly[0:30] on the connection to the delay element 14a. The decoding is such that the value of the delay setting indicates the number bits to assert on the decoding logic output dly[0:30]. So in the simplest example, if the delay setting is 00000 (zero) then no bits are asserted on the output dly[0:30], if the delay setting is 00001 (one) then one bit is asserted on the output dly[0:30], it the delay setting is 00010 (two) then two bits are asserted on the output dly[0:30], etc., up to the case where if the delay setting is 11111 (thirty-one) then all thirty-one bits of the output dly[0:30] are asserted. For example:

| Delay setting [0:4] | Decodes to dly[0:30] |
|---|---|
| 00000 | 0000000000000000000000000000000 |
| 00001 | 0000000000000000000000000000001 |
| 00010 | 0000000000000000000000000000011 |
| 00011 | 0000000000000000000000000000111 |
| 00100 | 0000000000000000000000000001111 |
| 00101 | 0000000000000000000000000011111 |
| 00110 | 0000000000000000000000000111111 |
| 00111 | 0000000000000000000000001111111 |
| ... | |
| 11100 | 0001111111111111111111111111111 |
| 11101 | 0011111111111111111111111111111 |
| 11110 | 0111111111111111111111111111111 |
| 11111 | 1111111111111111111111111111111 |

Each multiplexer 26(n) in the chain of the delay element 14a is switched by a respective one of the bits dly[0:30] from the output of the decode logic 16, determining whether the strobe signal must pass through the respective delay stage 24(n) or whether that delay stage 24(n) is bypassed. So a digitally selected number of delay stages 24 are included in the delay path between the strobe signal as input to the delay element and the delayed strobe, dependent on the output dly[31] from the decode logic.

Thus the delay can be digitally controlled by software running on the CPU 8. As mentioned, the circuit also comprises a characterisation circuit 18. This is for characterising the delay element 14a in order to determine what the delay setting should be in order to achieve the actual desired delay. Factors such as fluctuations in temperature or supply voltage mean that the behaviour of the delay element 14a will vary. That is, because of the properties of the components making up the delay element, a given delay setting in the register 20 may result in different actual delay times depending on conditions such as temperature or supply voltage. Thus the purpose of the characterisation circuit 18 is to characterise the delay element 14a in order to vary the delay setting to try to keep the actual time delay substantially constant in varying conditions.

Figure 3:
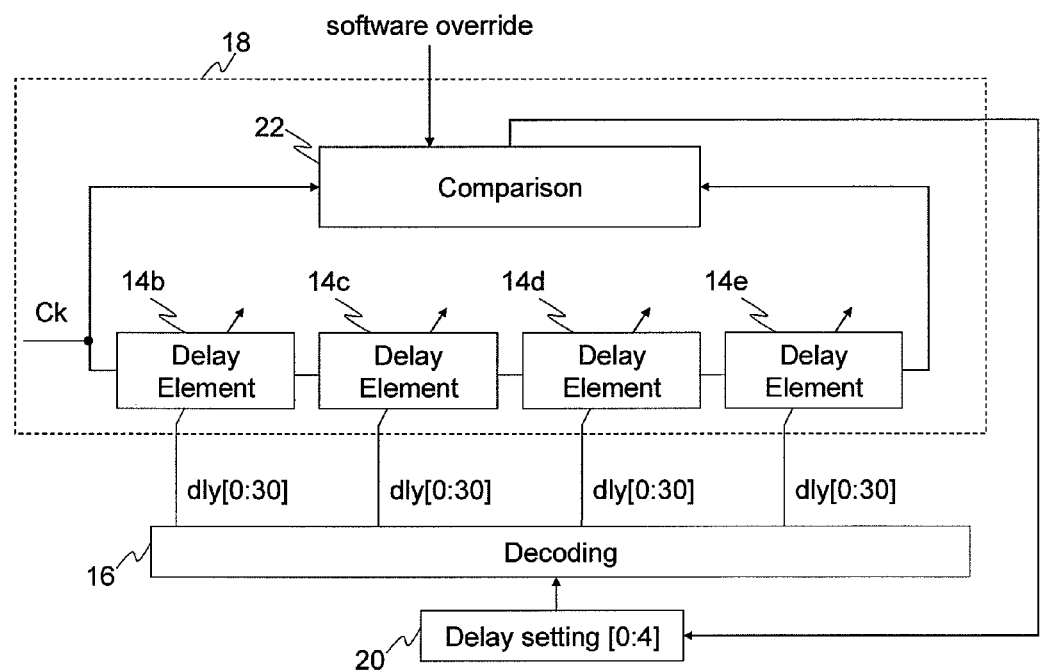
FIG. 3 is a schematic block diagram of a characterisation circuit.

The characterisation circuit 18 is shown schematically in FIG. 3, in conjunction with the decoding logic 16 and delay setting register 20 and connections thereto. The decoding logic and programmable delay setting register 20 are shared between the characterisation circuit 18 and the delay element 14a.

The characterisation circuit 18 is connected as a delay-locked loop (DLL). It comprises four delay stages 14b, 14c, 14d and 14e connected in series, each substantially identical to the delay element 14a used to delay the strobe signal. The clock signal ck (the same clock signal as clocks the DDR memory 4) is input to the first delay element 14b as well as to a comparison block 22, and the output of the last delay element in the series is also connected to the comparison block 22. Each delay element in the series is arranged to receive the same output dly[0:30] from the decoding logic 16, the same as the delay element 14a. The comparison block has an output coupled to the delay setting register 20.

In operation, the comparison block 22 of the DLL compares the delay of its output to the input clock to generate an error signal indicative of how much the total delay of all the delay elements in the series differs from one clock cycle. Based on that, the comparison logic 22 generates a characterised delay setting to correct for any difference and, when the software override is not asserted, supplies the characterised delay setting to the delay setting register 20 thus feeding it back to all of the delay elements 14b, 14c, a4d and 14e in the series. By this feedback mechanism, the total delay of all delay elements in the series is kept to substantially one clock cycle. In this case, four substantially identical delay elements are connected in the series so that their combined delay equals one clock cycle. So the characterised delay setting represents a delay of a quarter of a clock cycle.

The assumption is that each delay element will behave substantially the same (under variations in temperature or supply voltage, etc.) as the delay element 14a actually used to delay the strobe signal. Thus the delay setting determined by the comparison logic 22 can be taken as a suitable setting for the strobe delay element 14a.

Preferably, the DLL can also be disabled to reduce power consumption.

When the software override is not asserted, the characterisation circuit 18 controls the delay setting autonomously. But the resulting characterised delay setting is also readable by software, and as explained previously the software can also assert a software override so that the delay setting register is programmable by software. Thus the delay circuitry of the present invention is not completely autonomous.

Without the software programmable mechanism of the present invention, the delay circuitry would instead be a completely autonomous hardware mechanism, because a user or programmer of the chip could have absolutely no control over the delay setting after manufacture, i.e. the mechanism would be hard-wired. However, as mentioned, such hardware autonomy is disadvantageous because of the complex design required to avoid timing glitches. But advantageously, the delay circuitry described herein allows the task of monitoring and trimming the delay setting can be performed under software control. This means that timing can be handled in software, reducing the need for a complex hardware design. For example, the software can prevent a change in delay setting occurring at same time as a data transaction. There plenty of scope for fixing timing bugs by making adjustments to the software.

So according to everything above, the described embodiments provide the following advantageous features. Firstly, the ability for the delay settings in the DDR interface to be software programmable through internal registers (as opposed to implementing an autonomous delay control circuit). Secondly, a software controllable circuit for characterizing the digitally controlled delay circuit so that the correct setting can be calculated. Thirdly, a software controlled mechanism for holding off transactions with the DDR memory momentarily—allowing the delay settings to be adjusted without any risk of corrupted transactions. Fourthly, hardware components are simple, easily verified and have no complex interactions, thus minimizing the likelihood of hardware bugs.

And in a particularly preferred implementation, the digitally controlled delay elements are designed economically with a simple binary coded delay setting. There is no danger of any transitions being in-flight inside a delay component as it is adjusted since activity is suspended momentarily when adjustments are made. Further, the delay characterisation circuit is a very simple Delay-Locked-Loop that adjusts the delay of four digitally controlled delay elements in series so that their combined total delay equals one clock-cycle. The resulting delay setting is software readable. And the DLL can be disabled to reduce power consumption.

It will be appreciated that the above embodiments have been described only by way of example. In other embodiments, the interface circuit could be provided on the same chip as either of memory or the processor, or on a separate chip from both, or all of the memory, processor and interface circuit could be provided on the same chip. The processor could execute software from sources other than an internal memory. The interface circuit could be used to interface between a memory and other types of interfacing device, with the software control being provided from a processor separate to the interfacing device. The delay circuitry has been described as delaying strobes in both ingoing and outgoing directions (i.e. read and write strobes) but it could instead be used for only one of these. The characterisation circuit 18 has been described as providing its characterised delay setting to software via the same register 20 as used to program the setting, but in an alternative embodiment the characterisation circuit 18 could be readable by software via a path independent from the programmable register 20, such that the monitoring and trimming of the delay setting always passes via software. The programmable register 20 could be an entry in a register file, or could be replaced with a location in any memory or storage medium. Delays other than a quarter clock cycle could be introduced, which could be achieved by a different number of delay elements in the DLL of the characterisation circuit 18 and/or arranging the delays of the delay elements of the loop to add to a different integer or even non-integer number of clock cycles other than one. Further, in principle the data could be delayed instead of the strobe. Other uses and configurations may be apparent to the person skilled in the art given the disclosure herein. The scope of the invention is not limited by the described embodiments, but only be the following claims.

The invention claimed is:

1. A double data rate memory interface circuit for transferring data between an interfacing device and double data rate memory device clocked on both rising and falling edges of a clock signal, the interface circuit comprising:
 a data input for receiving a data signal from a first of said devices;
 a strobe input for receiving a strobe signal from said first device, the strobe signal validating the data signal for sampling by the other of said devices; and
 delay circuitry coupled to said data and strobe inputs for supplying the data and strobe signals to said other device with a timing offset introduced therebetween, the delay circuitry comprising a software programmable storage medium and a digitally controllable delay element coupled to the storage medium, the delay element being arranged to control said timing offset in dependence on a programmed delay setting programmed into said storage medium.

2. The memory interface circuit of claim 1, comprising characterisation circuitry for characterising said delay element in order to generate a characterised delay setting, the characterisation circuit being arranged such that the characterised delay setting is accessible to software.

3. The memory interface circuit of claim 2, wherein the characterisation circuit is coupled to said storage medium and is arranged to receive a software override, to supply said characterised delay setting to said storage medium to control said timing offset when the software override is not asserted, and to allow the timing offset to be controlled by the programmed delay setting when the software override is asserted.

4. The memory interface circuit of claim 3, wherein the characterised delay setting is accessible to software via said storage medium.

5. The memory interface circuit of claim 2, wherein the characterisation circuit is arranged to generate said characterised delay setting so as to represent a delay of substantially a quarter of a cycle of said clock signal.

6. The memory interface circuit of claim 2, wherein the characterisation circuit comprises a delay locked loop comprising a plurality N of delay elements in series, each substantially the same as the delay element of said delay circuitry, the delay locked loop being arranged to keep the total delay of said N delay elements substantially equal to a predetermined number M of cycles of said clock signal such that the characterised delay setting represents M/N of a cycle of said clock signal.

7. The memory interface circuit of claim 6, wherein M is one.

8. The memory interface circuit of claim 7, wherein N is four.

9. The memory interface circuit of claim 1, wherein the delay element is operable to hold off transfer of data whilst the delay setting in said storage medium is updated.

10. The memory interface circuit of claim 1, wherein the delay element comprises a plurality of delay stages, each stage being selectable for inclusion in a delay path in dependence on the delay setting in said storage medium.

11. The memory interface circuit of claim 1, wherein said storage medium comprises a software programmable register.

12. The memory interface circuit of claim 1, arranged to operate according to at least one of standards JESD79 and JESD209.

13. A method of transferring data between an interfacing device and a double data rate memory device clocked on both rising and falling edges of a clock signal, the interface circuit comprising:
   receiving a data signal from a first of said devices;
   receiving a strobe signal from said first device, the strobe signal validating the data signal for sampling by the other of said devices; and
   supplying the data and strobe signals to said other device with a timing offset introduced therebetween, by executing software to program a delay setting into a storage medium coupled to a digitally controllable delay element, thus operating the delay element to control said timing offset in dependence the delay setting programmed into said storage medium.

14. The method of claim 13, comprising characterising said delay element in order to generate a characterised delay setting, and accessing the characterised delay setting by software.

15. The method of claim 14, comprising generating a software override, supplying said characterised delay setting to said storage medium to control said timing offset when the software override is not asserted, and allowing the timing offset to be controlled by the programmed delay setting when the software override is asserted.

16. The method of claim 15, wherein the characterised delay setting is made accessible to software via said storage medium.

17. The method of claim 14, comprising generating said characterised delay setting so as to represent a delay of substantially a quarter of a cycle of said clock signal.

18. The method of claim 14, wherein said characterising comprises passing the clock signal through a delay locked loop comprising a plurality N of delay elements in series, each substantially the same as the delay element used to control said timing offset, and operating the delay locked loop to keep the total delay of said N delay elements substantially equal to a predetermined number M of cycles of said clock signal such that the characterised delay setting represents M/N of a cycle of said clock signal.

19. The method of claim 18, wherein M is one.

20. The method of claim 19, wherein N is four.

21. The method of claim 13, wherein said software holds off transfer of data whilst the delay setting in said storage medium is updated.

22. The method of claim 13, wherein the delay element comprises a plurality of delay stages, and said introduction of said timing offset comprises selecting said stages for inclusion in a delay path in dependence on the delay setting in said storage medium.

23. The method of claim 13, wherein said storage medium comprises a software programmable register.

24. The method of claim 13, comprising operating according to at least one of standards JESD79 and JESD209.

25. A system comprising a processor device, a double data rate memory device clocked on both rising and falling edges of a clock signal, and a memory interface circuit for transferring data between the processor device and the memory device, the memory interface circuit comprising:
   a data input for receiving a data signal from a first of said devices;
   a strobe input for receiving a strobe signal from said first device, the strobe signal validating the data signal for sampling by the other of said devices; and
   delay circuitry coupled to said data and strobe inputs for supplying the data and strobe signals to said other device with a timing offset introduced therebetween, the delay circuitry comprising a software programmable storage medium and a digitally controllable delay element coupled to the storage medium, the delay element being arranged to control said timing offset in dependence on a programmed delay setting programmed into said storage medium;
   wherein the processor is programmed to execute software to program said programmed delay setting into said storage medium.

26. The system of claim 25, wherein the interface circuit comprises characterisation circuitry for characterising said delay element in order to generate a characterised delay setting, the characterisation circuit being arranged such that the characterised delay setting is accessible to software.

27. The system of claim 26, wherein the characterisation circuit is coupled to said storage medium and is arranged to receive a software override from said software, to supply said characterised delay setting to said storage medium to control said timing offset when the software override is not asserted, and to allow the timing offset to be controlled by the programmed delay setting when the software override is asserted.

28. The system of claim 27, wherein the characterised delay setting is accessible to said software via said storage medium.

29. The system of claim 25, wherein said software is configured to generate said programmed delay setting so as to represent a delay of substantially a quarter of a cycle of said clock signal.

30. The system of claim 26, wherein the characterisation circuit comprises a delay locked loop comprising a plurality N of delay elements in series, each substantially the same as the delay element of said delay circuitry, the delay locked loop being arranged to keep the total delay of said N delay elements substantially equal to a predetermined number M of cycles of said clock signal such that the characterised delay setting represents M/N of a cycle of said clock signal.

31. The system of claim 30, wherein M is one.

32. The system of claim 31, wherein N is four.

33. The system of claim 25, wherein said software is configured to control the delay element to hold off transfer of data whilst the delay setting in said storage medium is updated.

34. The system of claim 25, wherein the delay element comprises a plurality of delay stages, each stage being selectable for inclusion in a delay path in dependence on the delay setting in said storage medium.

35. The system of claim 25, wherein said storage medium comprises a software programmable register.

36. The system of claim 25, arranged to operate according to at least one of standards JESD79 and JESD209.

* * * * *